(12) United States Patent
Ikeda et al.

(10) Patent No.: US 11,107,691 B2
(45) Date of Patent: Aug. 31, 2021

(54) METHOD OF MANUFACTURING SEMICONDUCTOR DEVICE

(71) Applicant: DENSO CORPORATION, Kariya (JP)

(72) Inventors: Toru Ikeda, Nagoya (JP); Tomohiko Mori, Nagakute (JP); Narumasa Soejima, Nagakute (JP); Hideya Yamadera, Nagakute (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/862,115

(22) Filed: Apr. 29, 2020

(65) Prior Publication Data

US 2020/0365409 A1 Nov. 19, 2020

(30) Foreign Application Priority Data

May 15, 2019 (JP) .............................. JP2019-092428

(51) Int. Cl.
*H01L 21/306* (2006.01)
*H01L 21/311* (2006.01)

(52) U.S. Cl.
CPC .. *H01L 21/30612* (2013.01); *H01L 21/31116* (2013.01)

(58) Field of Classification Search
CPC ......... H01L 21/30612; H01L 21/31116; H01L 21/30617; H01L 29/66
See application file for complete search history.

(56) References Cited

U.S. PATENT DOCUMENTS

| 2009/0087994 | A1* | 4/2009 | Lee ......................... H01L 33/22 438/704 |
| 2010/0078688 | A1 | 4/2010 | Otake et al. |
| 2014/0042448 | A1* | 2/2014 | Ostermaier ......... H01L 21/7605 257/76 |
| 2020/0287008 | A1* | 9/2020 | Nishii ............... H01L 29/66727 |

FOREIGN PATENT DOCUMENTS

JP 2008-205414 A 9/2008

* cited by examiner

*Primary Examiner* — Anita K Alanko
(74) *Attorney, Agent, or Firm* — Sughrue Mion, PLLC

(57) ABSTRACT

A method of manufacturing a semiconductor device is provided, and the method may include: preparing a semiconductor substrate constituted of a group III nitride semiconductor, a main surface of the semiconductor substrate being a c-plane; forming a grove on the main surface by dry dry-etching the main surface; and wet-etching an inner surface of the groove using an etchant to expose the c-plane of the semiconductor substrate in a wet-etched region, the etching having an etching rate to the c-plane of the semiconductor substrate that is lower than the etching rate to a plane other than the c-plane of the semiconductor substrate.

3 Claims, 4 Drawing Sheets

METHOD OF MANUFACTURING SEMICONDUCTOR DEVICE

CROSS-REFERENCE TO RELATED APPLICATION

This application claims priority to Japanese Patent Application No. 2019-092428, filed on May 15, 2019, the entire contents of which am incorporated herein by reference.

TECHNICAL FIELD

The art disclosed herein relates to a method of manufacturing a semiconductor device.

BACKGROUND

Japanese Patent Application Publication No. 2008-205414 describes a semiconductor device including a semiconductor substrate constituted of a group III nitride semiconductor. This semiconductor device includes a groove provided on an upper surface of the semiconductor substrate, a gate insulating film covering a side surface of the groove, and a gate electrode covering a front surface of the gate insulating film. The semiconductor substrate includes an n-type source region, a p-type body region, and an n-type drain region. The source region is exposed on the upper surface of the semiconductor substrate and on the side surface of the groove. The body region is exposed on the side surface of the groove below the source region. The drain region is exposed on the side surface of the groove below the body region.

In a method of manufacturing the aforementioned semiconductor device, first, a semiconductor substrate in which the drain region, the body region, and the source region are stacked is prepared. Then, the upper surface (i.e., a c-plane) of the semiconductor substrate is dry-etched to form a groove on whose side surface the source region, a channel region, and the drain region are exposed. In doing so, a surface other than the c-plane (a non-polar surface or a semi-polar surface) is exposed on the side surface of the groove. Next, the side surface of the groove is wet-etched to remove a damaged layer caused by the dry etching. Thereafter, the gate insulating film, the gate electrode, and the like are formed, whereby the semiconductor device is completed. In the semiconductor device described in Japanese Patent Application Publication No. 2008-205414, since the damaged layer caused by the dry etching is removed, an interface state between the side surface of the groove (i.e., the semiconductor substrate) and the gate insulating film can be reduced.

SUMMARY

In a group III nitride semiconductor, it is difficult to wet-etch its c-plane. Therefore, when damage exists on the c-plane, it is difficult to remove its damaged layer formed on the c-plane by wet-etching. For this reason, the has been a problem where, in a case where a damaged layer in a surface layer portion in the group III nitride semiconductor is to be removed, it is necessary to expose a surface other than the c-plane, and a design of the semiconductor device is accordingly limited. The present disclosure provides art configured to expose a c-plane with less damage in a semiconductor substrate constituted of a group III nitride semiconductor.

A method of manufacturing a semiconductor device is disclosed herein, and the method may comprise: preparing a semiconductor substrate constituted of a group III nitride semiconductor, a main surface of the semiconductor substrate being a c-plane; forming a groove on the main surface by dry-etching the main surface; and wet-etching an inner surface of the groove using an etchant to expose the c-plane of the semiconductor substrate in a wet-etched region, the etchant having an etching rate to the c-plane of the semiconductor substrate that is lower than the etching rate to a plane other than the c-plane of the semiconductor substrate.

In the aforementioned manufacturing method, first, the groove is formed on the main surface (c-plane) of the semiconductor substrate by dry-etching. As a result of this, a surface other than the c-plane is exposed on a side surface of the formed groove. Then, wet-etching is performed on the inner surface of the groove. The wet-etching is performed using the etchant whose etching rate with respect to the c-plane is lower than the etching rate with respect to the plane other than the c-plane. Since the side surface of the groove is the surface other than the c-plane, the etching to the side surface proceeds by the wet-etching. The etching of the side surface of the groove causes the c-plane to be exposed at a boundary between the side surface and the bottom surface of the groove. Since the etching is difficult to progress on the exposed c-plane, the state in which the c-plane is exposed is maintained. Therefore, as the etching of the side surface of the groove progresses, an exposed range of the c-plane increases. Therefore, the c-plane can be exposed on the surface after the etching. In the wet etching, the surface after the etching is unlikely to be damaged. Therefore, according to this method, it is possible to expose a c-plane which is less damaged.

DETAILED DESCRIPTION

First Embodiment

Figure 1:
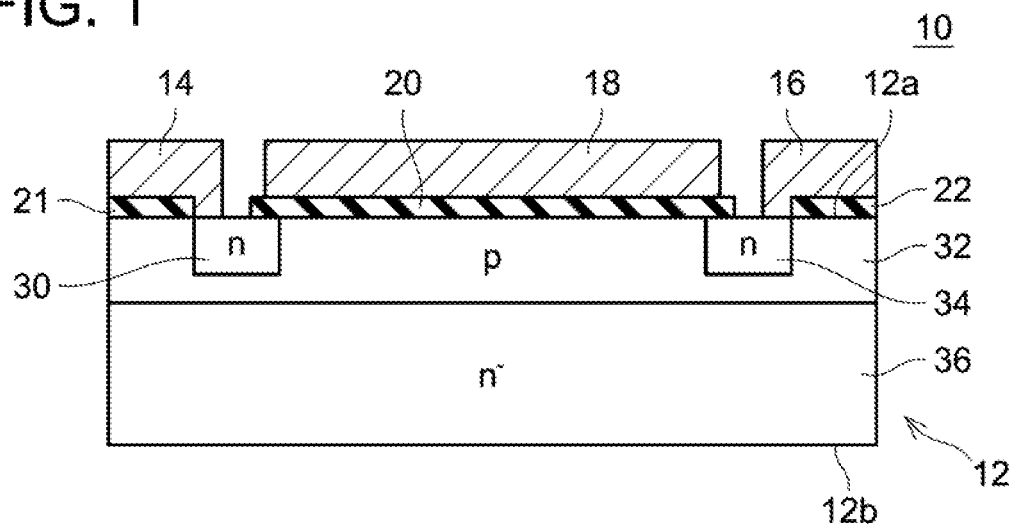
FIG. 1 is a cross-sectional view of a semiconductor device 10.

Referring to FIG. 1, a semiconductor device 10 according to a first embodiment will be described. The semiconductor device 10 comprises a semiconductor substrate 12, a source electrode 14, a drain electrode 16, a gate electrode IL a gate insulating film 20, and interlayer insulating films 21 and 22. In this embodiment, the semiconductor device 10 is a Metal-Oxide-Semiconductor Field-Effect Transistor (MOSFET).

The semiconductor substrate 12 is constituted of a group III nitride semiconductor. An example of the group III nitride semiconductor is GaN (gallium nitride). The semiconductor substrate 12 has an upper surface 12a and a lower surface 12b. The upper surface 12a of the semiconductor substrate 12 is a c-plane. The semiconductor substrate 12 is provided with a source region 30, a body region 32, a drain region 34, and an n-type region 36.

The source region 30 is of an n-type. The source region 30 is provided in a range exposed on a part of the upper surface 12a of the semiconductor substrate 12.

The drain region 34 is of an n-type. The drain region 34 is provided in a range exposed on a part of the upper surface 12a of the semiconductor substrate 12. The drain region 34 is spaced apart from the source region 30.

The body region 32 is of a p-type. The body region 32 extends from a range exposed on the upper surface 12a of the semiconductor substrate 12 to under sides of the source region 30 and the drain region 34. The body region 32 surrounds a periphery of the source region 30 and a periphery of the drain region 34. The body region 32 separates the source region 30 and the drain region 34.

The n-type region 36 is disposed below the body region 32. The n-type region 36 is exposed on the lower surface 12b of the semiconductor substrate 12. The n-type region 36 is separated from the source region 30 and the drain region 34 by the body region 32.

The gate insulating film 20 and interlayer insulating films 21 and 22 are provided on the upper surface 12a of the semiconductor substrate 12. The gate insulating film 20 covers the upper surface 12a of the semiconductor substrate 12 in a range between the source region 30 and the drain region 34. The interlayer insulating film 21 covers the upper surface 12a of the semicondutor substrate 12 in a range of a vicinity of the source region 30 (a range opposite to the drain region 34). The interlayer insulating film 22 coves the upper surface 12a of the semiconductor substrate 12 in a range of a vicinity of the drain region 34 (a range opposite to the source region 30). The gate insulating film 20 and the interlayer insulating films 21 and 22 are constituted of, for example, silicon dioxide ($SiO_2$).

The source electrode 14 is provided in a range traversing over an upper surface of the interlayer insulating film 21 and the upper surface 12a of the semiconductor substrate 12. The source electrode 14 is in contact with the upper surface 12a of the semiconductor substrate 12 in a range where the source region 30 is exposed (i.e. in a range between the interlayer insulating film 21 and the gate insulating film 20).

The drain electrode 16 is provided in a range traversing over an upper surface of the interlayer insulating film 22 and the upper surface 12a of the semiconductor substrate 12. The drain electrode 16 is in contact with the upper surface 12a of the semiconductor substrate 12 in a range where the drain region 34 is exposed.

The gate electrode 18 is provided on the upper surface of the gate insulating film 20. The gate electrode 18 is opposed to the body region 32 with the gate insulating film 20 interposed therebetween in the range between the source region 30 and the drain region 34.

The gate electrode 18 is insulated film the semiconductor substrate 12 by the gate insulating film 20. The source electrode 14, the drain electrode 16, and the gate electrode 18 are insulated from each other. The source electrode 14, the drain electrode 16, and the gate electrode 18 are constituted of aluminum (Al), for example.

Next, an operation of the semiconductor device 10 will be described. When the semicondutor device 10 is in use, the semiconductor device 10, a load (e.g. a motor), and a power source are connected in series. A power supply voltage is applied to the series circuit of the semiconductor device 10 and the load. The power supply voltage is applied in a direction in which the drain electrode 16 side of the semiconductor device 10 has a higher potential than the source electrode 14 side. When an on-potential (a potential equal to or higher than a gate threshold) is applied to the gate electrode 18, a channel is formed in the body region 32 in a range in contact with the gate insulating film 20, and the semiconductor device 10 is turned on. When an off potential (a potential lower than the gate threshold) is applied to the gate electrode 18, the channel disappears and the semiconductor device 10 is turned off.

Figure 2:
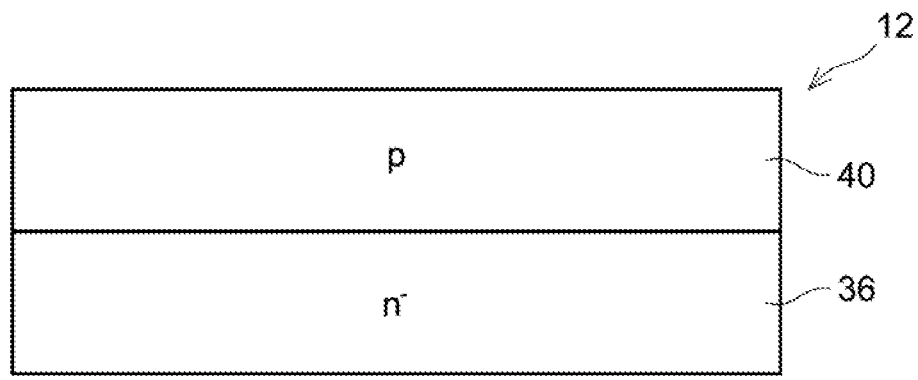
FIG. 2 is a diagram for explaining a manufacturing process of the semiconductor device 10.

Next, a method of manufacturing the semiconductor device 10 of the present embodiment will be described. First, as shown in FIG. 2, a substrate (n-type region 36) having an upper surface which is a c-plane and constituted of n-type GaN is prepared. Then, a p-type GaN layer 40 is formed on an upper surface of the n-type region 36 by epitaxial growth. The GaN layer 40 is formed on the c-plane of the n-type region 36. Therefore, an upper surface of the formed GaN layer 40 also becomes the c-plane. Hereinafter, entireties of the n-type region 36 and the GaN layer 40 will be referred to as a semiconductor substrate 12 as a whole.

Figure 3:
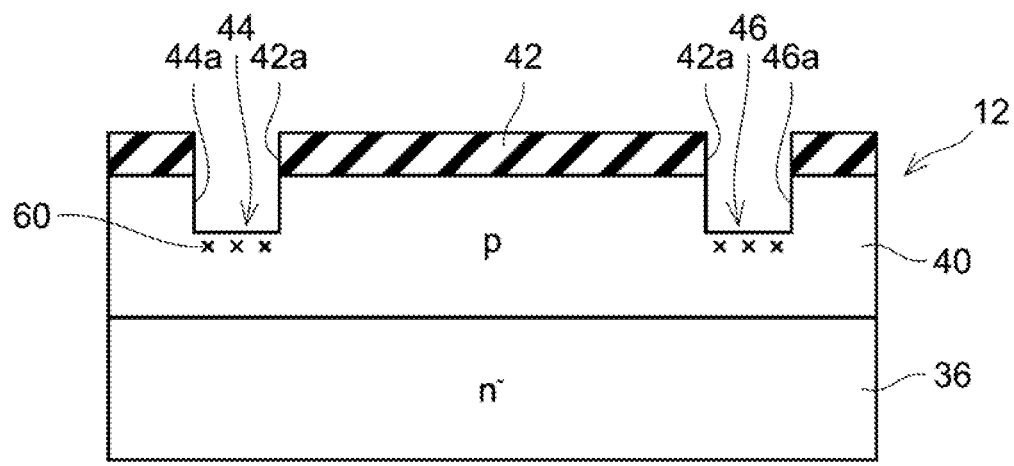
FIG. 3 is a diagram for explaining the manufacturing process of the semiconductor device 10.

Next, as shown in FIG. 3, a mask 42 having a plurality of openings 42a is formed on the upper surface of the semiconductor substrate 12. The respective openings 42a are provided above a range in which the source region 30 is to be formed and above a range in which the drain region 34 is to be formed. Then, the semiconductor substrate 12 is dry-etched through the mask 42 to form grooves 44 and 46 on the upper surface of the semiconductor substrate 12. Depths of the grooves 44 and 46 are smaller than a thickness of the GaN layer 40. Since the upper surface of the semiconductor substrate 12 is the c-plane, surfaces other than the c-plane are exposed on side surfaces 44a and 46a of the grooves 44 and 46 which are surfaces intersecting the upper surface of the semiconductor substrate 12. In this process, a damaged layer 60 caused by the dry etching is formed in each of regions exposed on bottom surfaces of the grooves 44 and 46. After the dry etching, the mask 42 is removed.

Figure 4:
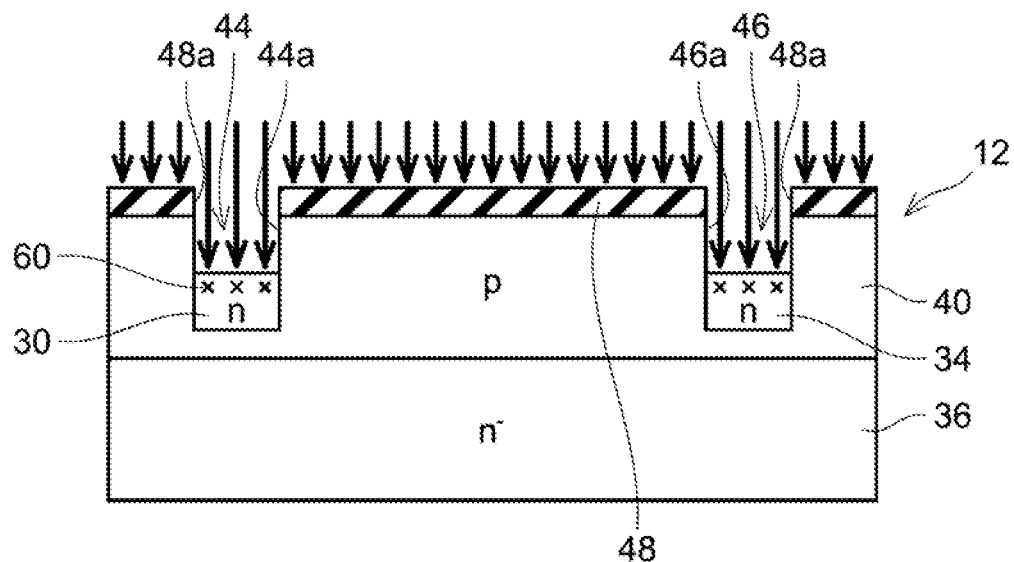
FIG. 4 is a diagram for explaining the manufacturing process of the semiconductor device 10.

Next, after the mask 42 has been removed, as shown in FIG. 4, a mask 4 having a plurality of openings 48a is formed by for example, plasma-enhanced Chemical Vapor Deposition (CVD). The respective openings 48a are provided above the grooves 44 and 46. That is, inner surfaces of the grooves 44 and 46 are exposed by the respective openings 48a. The mask 48 is constituted of $SiO_2$, for example. Then, n-type impurities (e.g., Si) are ion-implanted into the upper surface of the semiconductor substrate 12 through the mask 48, in a range where the mask 48 exists, the n-type impurities are blocked by the mask 48. In a range in which the mask 48 does not exist (a range in which each opening 48a exists), the n-type impurities are implanted into the semiconductor substrate 12. In this process, an irradiation ene y of the n-type impurities is adjusted so that the n-type impurities are implanted at positions which am in vicinities of the bottom surfaces of the grooves 44 and 46 (i.e. the surface layer portion) and are shallower than the n-type region 36. After the n-type impurities have been implanted into the semiconductor substrate 12, the semiconductor substrate 12 is annealed to activate the implanted n-type impurities. As a result, a region which becomes the source region is formed in a region exposed on the bottom surface of the groove 44, and a region which becomes the drain region 34 is formed in a region exposed on the bottom surface of the groove 46. The source region 30 and drain region 34 are separated from the n-type region 36 by the GaN layer 40. After the ion implantation, the mask 48 is removed.

Figure 5:
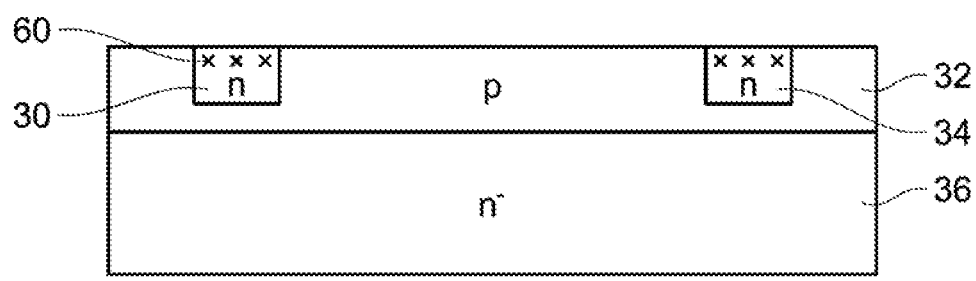
FIG. 5 is a diagram for explaining the manufacturing process of the semiconductor device 10.

Next, as shown in FIG. 5, the c-plane of the GaN layer 40 is exposed by wet-etching the inner surfaces of the grooves 44 and 46. Here, the wet etching is performed using an etchant an etching rate of which with respect to the c-plane of the GaN layer 40 is lower than an etching rate with respect to a plane other than the c-plane of the GaN layer 40. More specifically, an etchant by which the c-plane of the GaN layer 40 is hardly etched is used. For example, tetromethylammonium hydroxide (TMAH), phosphoric acid ($H_3PO_4$) may be used as the etchant. As described above, since the side surfaces 44a and 46a of the grooves 44 and 46 are surfaces other than the c-plane, the etching proceeds by this wet etching. On the other hand, since the bottom surfaces of the grooves 44 and 46 substantially coincide with the c-plane, they are hardly etched. When the side surface 44a of the groove 44 is etched, the c-plane is exposed at a boundary between the side surface 44a and the bottom surface of the groove 44. Since the etching hardly progresses on the exposed c-plane, a state in which the c-plane is exposed is maintained. Therefore, as the etching of the side surface 44a of the groove 44 progresses, the exposed range of the c-plane increases. The same applies to the groove 46. In this manner, the wet etching is performed until the exposed c-plane extends over the entire upper surface of the GaN layer 40. Since the GaN layer 40 is etched by the wet etching in this process, the c-plane after etching is unlikely to be damaged. Therefore, the surface (c-plane) of the GaN layer 40 after the wet etching has little damage except for the ranges in which the grooves 44 and 46 existed (the ranges in which the source region 30 and the drain region 34 are formed). The p-type GaN layer 40 remaining after the wet etching sews as the body region 32.

Figure 6:
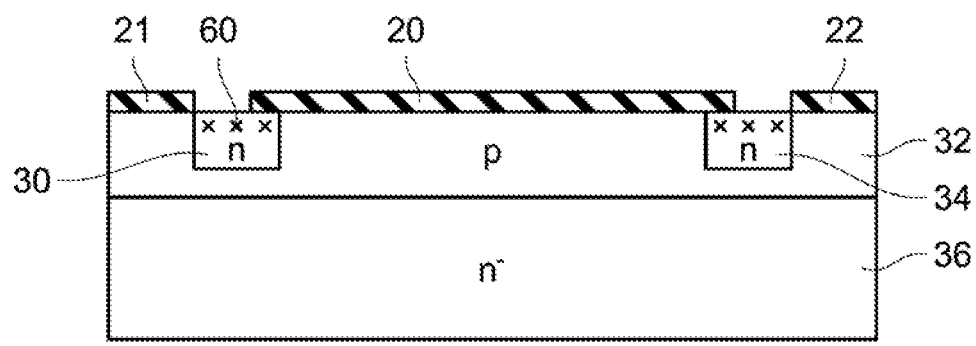
FIG. 6 is a diagram for explaining the manufacturing process of the semiconductor device 10.

Next, as shown in FIG. 6, the gate insulating film 20 and the interlayer insulating films 21 and 22 are formed on the upper surface of the GaN layer 40 after the wet etching. For example, an oxide film covering substantially the entire upper surface of the GaN layer 40 is formed and then the oxide film is selectively etched such that the oxide film can be divided into the gate insulating film 20 and the interlayer insulating films 21 and 22. Here, each of the insulating films is formed so that the source region 30 is exposed between the gate insulating film 20 and the interlayer insulating film 21, and the drain region 34 is exposed between the gate insulating film 20 and the interlayer insulating film 22. Thereafter, the source electrode 14, the drain electrode 16, and the gate electrode 18 are formed by known method(s), thereby completing the semiconductor device 10 shown in FIG. 1.

As described above, in the manufacturing method of the present embodiment, first, by forming the grooves 44 and 46 on the c-plane of the GaN layer 40, the surfaces other than the c-plane are exposed on the side surfaces of the grooves 44 and 46. Then, by wet-etching the side surfaces of the grooves 44 and 46, the c-plane is exposed on the surface of the GaN layer 40 after the wet etching. As described above, in the present embodiment, while the range of the damaged layer 60 caused by the dry etching is suppressed to be small, the c-plane which has little damage can be exposed on a wide range by the wet etching.

Further, in the manufacturing method of the present embodiment, the source region 30 and the drain region 34 are formed in the regions where the damaged layers 60 exist, and the gate electrode 18 is formed in the range facing the region whom the damaged layers 60 do not exist. That is, when the semiconductor device 10 is turned on, the channel is formed in the less damaged region. Therefore a channel resistance of the semiconductor device 10 is low. Although the source region 30 and the drain region 34 are formed in the regions including the damaged layers 60, they have little influence on characteristics of the semiconductor device 10.

Planes other than the c-plane include a m-plane, a-plane, and other planes. Here, it is known that an wet etching rate decreases in an order of a-plane>other planes>m-plane if tetramethylammonium hydroxide (TMAH) phosphoric acid ($H_3PO$) or the like is used as an etchant. That is, the etching rate of the m-plane is the smallest in the planes other than the c-plane. Therefore, when wet etching is performed on a surface other than the c-plane, the m-plane is exposed on its etched surface. Therefore, in GaN having a hexagonal crystal structure, when the side surface of a groove is etched, a shape of the groove may be a hexagonal shape having the m-plane as each side. This phenomenon can be utilized to improve efficiency of wet etching.

Figure 7:
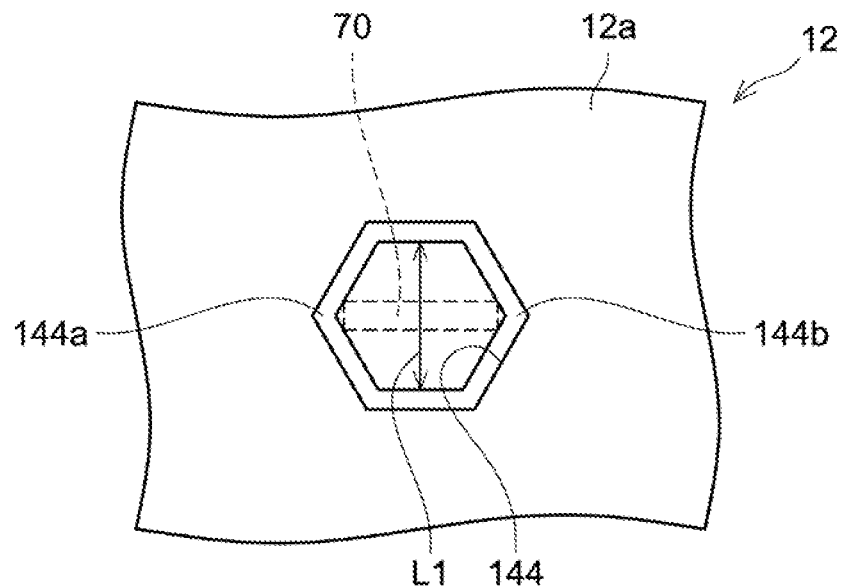
FIG. 7 is a plan view of a semiconductor substrate 12 for explaining an example of a region in which a groove is formed.

FIG. 7 is a plan view of the semiconductor substrate 12. As shown in FIG. 7, a case in which a groove 144, which is a trajectory of a periphery of a regular hexagon, is formed on the upper surface 12a of the semiconductor substrate 12 so as to surround a region 70 in which a channel is to be formed, will be considered. That is, in FIG. 7, the c-plane is exposed by wet-etching a region inside the groove 144. A source region is formed on a bottom surface of a corner 144a of the groove 144, and a drain region is formed on a bottom surface of a corner 144b of the groove 144. Each side of the groove 144 is formed to be a side parallel to the m-plane of the semiconductor substrate 12. Since the wet etching proceeds isotropicaly with respect to the m-plane, a duration required for etching the region inside the groove 144 is equal to a duration required for etching a distance L between opposite sides of the groove 144. Here, if the damage in the region in which the channel is to be formed is small, even if the damaged layer exists in another region, the influence on the semiconductor device is small. That is, the c-plane may be exposed by wet-etching at least in the region 70 where the channel is to be formed.

Figure 8:
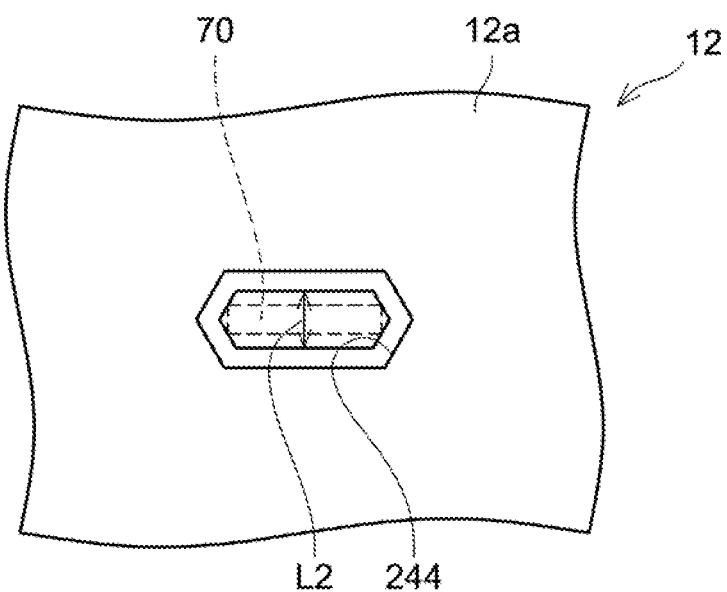
FIG. 8 is a plan view of the semiconductor substrate 12 for explaining an example of a region in which a groove is formed.

Therefore, as shown in FIG. 8, a case in which a groove 244 in which an interval between opposite sides parallel to a longitudinal direction of the region 70 is reduced is formed will be considered. In this case, a duration required for etching a region inside the groove 244 is equal to a duration required for etching a distance L2 between the opposite sides parallel to the longitudinal direction of the region 70. That is, the duration required for etching the region inside the groove 244 is shorter than the duration required for etching the region inside the 3 groove 144. As such, by making the interval between the opposite sides of a groove formed by dry etching closer to a width of the region 70 in which the channel is to be formed, the duration required for wet etching can be shortened.

Second Embodiment

Figure 9:
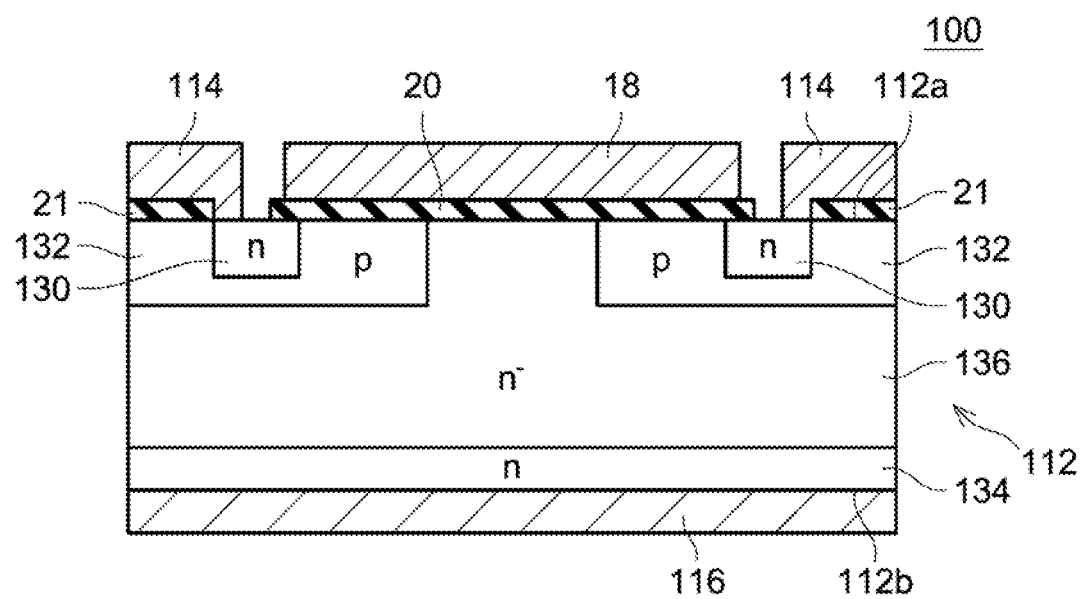
FIG. 9 is a cross-sectional view of a semiconductor device 100.

The semiconductor device 100 of the second embodiment differs from the semiconductor device 10 of FIG. 1 in following points. In the semiconductor device 100 shown in FIG. 9, a drain region 134 is provided in a range exposed on a lower surface 112b of a semiconductor substrate 112, and a drain electrode 116 is in contact with a lower surface 112b of the semiconductor substrate 112. The drain region 34 and the drain electrode 16 of the semiconductor device 10 shown in FIG. 1 function as source regions 130 and a source electrode 114 in the semiconductor device 100. In the semiconductor device 100, an n-type region 136 corresponding to the n-type region 36 of the semiconductor device 10 is exposed on an upper surface 112a of the semiconductor substrate 112 in a range between the two source regions 130. That is, the body region 132 is divided by the n-type region 136. In the semiconductor device 100, the n-type region 136 functions as adrift region. That is, the semiconductor device 100 is a vertical MOSFET.

In a manufacturing method of the semiconductor device 100, similarly to the first embodiment, a groove is formed in an upper portion of a range in which two source regions 130 are to be formed (see FIG. 3), and a c-plane is exposed by wet-etching an inner surface of the groove (see FIG. 5). Then, a gate electrode 18 is formed in a range opposed to the c-plane exposed by the wet etching (i.e., a region with little damage). Therefore, also in this semiconductor device 100, a channel is formed in the region with little damage when the semiconductor device 100 is turned on. Therefore, the channel resistance of the semiconductor device 100 is low.

In the above-described embodiments, the MOSFETs have been described, but the art disclosed in this disclosure may be applied to an IGBT. By providing a p-type region instead of the n-type drain region 134, an IGBT structure can be obtained.

Reference Example

Generally, each of the semiconductor devices as described above is manufactured by firstly forming a plurality of semiconductor devices inside a semiconductor wafer and then dividing the semiconductor wafer into a plurality of chips by dicing. When the semiconductor wafer is diced, unnecessary metal element(s) are taken from the diced surface and contained in chip(s), and the chip(s) may be contaminated. The art disclosed herein is also useful in removing such metal contamination. For example, when a main surface of the semiconductor wafer is set to the c-plane, the wet etching disclosed herein may be performed on side surfaces of the divided chips. As described above, in the wet etching disclosed herein, the etching mainly proceeds on a surface other than the c-plane. Therefore, by performing wet etching on a side surface of a chip whose upper surface is constituted of the c-plane, the side surface can be etched while the upper surface (c-plane) is hardly etched. Therefore, it is possible to remove the metal element (s) incorporated into the chip(s), which was difficult to remove only by cleaning the chip(s).

Some of the technical features disclosed herein will herein be listed. It should be noted that the respective technical elements are independently useful.

According to an aspect of the manufacturing method disclosed herein, the method may further comprise: forming a source region and a drain region in the semiconductor substrate so that the c-plane exposed by the wet etching is located between the source region and the drain region; and forming agate electrode at a position facing the c-plane located between the source region and the drain region.

In the configuration as aforementioned, a region between the source region and the drain region is a region with little damage. By forming the gate electrode facing this region, a channel can be formed in the region which has little damage when the semiconductor device is turned on. Therefore, the channel resistance is reduced. It should be noted that even if the source region and/or the drain region are formed in a region with relatively large damage, the characteristics of a semiconductor device are not significantly affected.

According to another aspect of the manufacturing method disclosed herein, the forming of the source region and the drain region may comprise forming at least one of the source region and the drain region at a position of a bottom surface of the groove.

According to another aspect of the manufacturing method disclosed herein, the forming of the groove on the main surface may comprise forming a first groove and a second groove on the main surface, and the forming of the source region and the drain region may comprise forming the source region at a position of a bottom surface of the first groove and forming the drain region at a position of a bottom surface of the second groove.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A method for manufacturing a semiconductor device, the method comprising:
   preparing a semiconductor substrate constituted of a group III nitride semiconductor and including a p-type body region, a main surface of the semiconductor substrate being a c-plane;
   forming a groove on the main surface by dry-etching the main surface; and
   wet-etching an inner surface of the groove using an etchant to expose the c-plane including the body region in a wet-etched region, the etchant having an etching rate to the c-plane of the semiconductor substrate that is lower than the etching rate to a plane other than the c-plane of the semiconductor substrate;
   forming an n-type source region and an n-type drain region in the semiconductor substrate such that the c-plane exposed by the wet etching includes the source region and the drain region, and the body region is located between the source region and the drain region on the c-plane exposed by the wet etching; and
   forming a gate electrode at a position facing an area between the source region and the drain region of the c-plane exposed by the wet etching.

2. The method of claim 1, wherein
the forming of the source region and the drain region comprises forming at least one of the source region and the drain region at a position of a bottom surface of the groove.

3. The method of claim 2, wherein
the forming of the groove on the main surface comprises forming a first groove and a second groove on the main surface, and
the forming of the source region and the drain region comprises forming the source region at a position of a bottom surface of the first groove and forming the drain region at a position of a bottom surface of the second groove.

* * * * *